United States Patent
Govoreanu et al.

(10) Patent No.: US 8,119,511 B2
(45) Date of Patent: Feb. 21, 2012

(54) NON-VOLATILE MEMORY DEVICE WITH IMPROVED IMMUNITY TO ERASE SATURATION AND METHOD FOR MANUFACTURING SAME

(75) Inventors: Bogdan Govoreanu, Hulshout (BE); HongYu Yu, Singapore (SG); Hag-Ju Cho, Seoul (KR)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/080,562

(22) Filed: Apr. 5, 2011

(65) Prior Publication Data
US 2011/0183509 A1    Jul. 28, 2011

Related U.S. Application Data

(62) Division of application No. 12/275,888, filed on Nov. 21, 2008, now abandoned.

(60) Provisional application No. 60/990,130, filed on Nov. 26, 2007.

(30) Foreign Application Priority Data

Nov. 22, 2007    (EP) .................................... 07121292

(51) Int. Cl.
*H01L 21/28* (2006.01)
(52) U.S. Cl. ........ 438/591; 438/216; 257/314; 257/324; 257/326; 257/E21.21; 257/E29.309
(58) Field of Classification Search ........... 438/591.216; 257/314, 324, 326
See application file for complete search history.

(56) References Cited

U.S. PATENT DOCUMENTS

| | | | |
|---|---|---|---|
| 6,597,036 B1 | 7/2003 | Lee et al. | |
| 2005/0106793 A1 | 5/2005 | Dong et al. | |
| 2006/0175656 A1* | 8/2006 | Govoreanu et al. | 257/321 |
| 2006/0189055 A1* | 8/2006 | Park et al. | 438/197 |
| 2006/0261398 A1 | 11/2006 | Lee | |

(Continued)

FOREIGN PATENT DOCUMENTS

EP    1 748 473    1/2007

OTHER PUBLICATIONS

Chen, Y. Y., "Characterization of Inter-Poly High-k Dielectrics for Next Generation Stacked-Gate Flash Memories,"Emerging Technologies—Nanoelectronics, 2006 IEEE Conference, pp. 463-466.

(Continued)

*Primary Examiner* — Ahmed Sefer
(74) *Attorney, Agent, or Firm* — McDonnell Boehnen Hulbert & Berghoff LLP

(57) ABSTRACT

A non-volatile memory device having a control gate on top of the second dielectric (interpoly or blocking dielectric), at least a bottom layer of the control gate in contact with the second dielectric being constructed in a material having a predefined high work-function and showing a tendency to reduce its work-function when in contact with a group of certain high-k materials after full device fabrication. At least a top layer of the second dielectric, separating the bottom layer of the control gate from the rest of the second dielectric, is constructed in a predetermined high-k material, chosen outside the group for avoiding a reduction in the work-function of the material of the bottom layer of the control gate. In the manufacturing method, the top layer is created in the second dielectric before applying the control gate.

8 Claims, 5 Drawing Sheets

U.S. PATENT DOCUMENTS

2007/0215929 A1* 9/2007 Yasuda ........................ 257/314
2008/0121962 A1 5/2008 Forbes et al.
2009/0134453 A1 5/2009 Govoreanu et al.

OTHER PUBLICATIONS

European Search Report for EP Pat. Application No. 07121292.2-2203, dated Apr. 3, 2008.

Examination Report for EP Pat. Application No. 07121292.2-2203, dated Feb. 24, 2009.

Examination Report for EP Pat. Application No. 07121292.2-2203, dated Jul. 9, 2009.

Examination Report for EP Pat. Application No. 07121292.2-2203, dated Jan. 26, 2010.

Examination Report for EP Pat. Application No. 07121292.2-2203, dated Sep. 8, 2010.

Yu H. Y. et al, "Fermi Pinning-Induced Thermal Instability of Metal-Gate Work Functions", IEEE Electron Device Letters, vol. 25, No. 5, May 2004, pp. 337-339.

Non-Final Office Action for U.S. Appl. No. 12/275,888, mailed Oct. 7, 2010.

* cited by examiner

US 8,119,511 B2

NON-VOLATILE MEMORY DEVICE WITH IMPROVED IMMUNITY TO ERASE SATURATION AND METHOD FOR MANUFACTURING SAME

CROSS-REFERENCE TO RELATED APPLICATIONS

This application is a divisional application of U.S. patent application Ser. No. 12/275,888, filed Oct. 21, 2008, which claims priority to European Patent Application No. 07121292.2 filed Nov. 22, 2007 and U.S. Provisional Application Ser. No. 60/990,130 filed Nov. 26, 2007, the contents of all of which are incorporated by reference herein in their entireties.

TECHNICAL FIELD OF THE INVENTION

The present invention relates to a non-volatile memory device and a method for manufacturing a non-volatile memory device.

BACKGROUND OF THE INVENTION

Erase saturation refers to the inability to erase a floating gate memory cell by removing charge from the floating gate to the Si channel through the tunnel oxide. This effect occurs because the parasitic current injected from the control gate towards the floating gate through the interpoly dielectric. The same problem arises in charge trapping non-volatile memory cells in which charge is stored in a charge trapping gate and the upper dielectric is called the blocking dielectric.

A way to avoid erase saturation consists in using high-k dielectrics with high-workfunction metal gates. However, metal gates are difficult to integrate in a conventional process flow. In addition, they show a tendency to change the effective workfunction towards midgap, when deposited on some dielectric materials, likely consequence of the inherent thermal steps following their deposition. Use of a p-type polysilicon control gate, as is a trend nowadays, may be compromised by this so-called Fermi level pinning (FLP) effect. Furthermore, using a p-type poly-Si may require application of a higher erase voltage, in order to compensate for possible polysilicon depletion effect.

DISCLOSURE OF THE INVENTION

Provided is a non-volatile memory device with improved immunity to erase saturation and a method for manufacturing such a non-volatile memory device.

A preferred embodiment provides a non-volatile memory device having a stacked structure comprising a substrate with a channel between two doped regions, a first dielectric on top of the channel, a charge storage medium on top of the first dielectric, a second dielectric on top of the charge storage medium and a control gate on top of the second dielectric. The first dielectric is the so-called tunnel dielectric, which is provided for enabling tunnelling of electrons or holes towards or from the charge storage medium. The charge storage medium can be a conductive floating gate or a charge trapping layer, i.e. a layer with discrete charge storage sites. The second dielectric on top of the charge storage medium can be the interpoly dielectric (in the case of a floating gate) or the blocking dielectric (in the case of a charge trapping layer).

In one embodiment, the control gate, or at least a bottom layer thereof which is in contact with the second dielectric, is constructed in a material having a predefined high work-function and showing a tendency to reduce its work-function when in contact with a group of certain high-k (i.e. $k > k_{SiO2}$) materials after full device fabrication. Furthermore, the second dielectric, or at least a top layer thereof which separates the bottom layer of the control gate from the rest of the second dielectric, is constructed in a predetermined high-k material, chosen outside the group for avoiding a reduction in the work-function of the material of the bottom layer of the control gate. As a result, a separation is achieved between the material of at least the bottom layer of the control gate and a high-k material of the group which may be present in the second dielectric below the top layer. Consequently, a reduction in the work-function of the material of at least the bottom layer of the control gate after full device fabrication can be avoided and it can more easily be provided that the work-function at the interface between control gate and second dielectric is high enough to avoid or at least reduce erase saturation.

In one embodiment, the top layer is constructed in the second dielectric in an additional step before applying the control gate. In the embodiment, the second dielectric or an upper part thereof is constructed in a high-k material of the specified group and the mentioned reduction in work-function is counteracted by nitridation of this high-k material before applying the control gate. This nitridation is preferably performed by means of a Decoupled Plasma Nitridation (DPN) step or an ammonia anneal step. The result of the nitridation is that the material properties of the high-k material at least at the interface with the control gate are altered, in such a way that a reduction in the work-function of the material of the control gate at the interface no longer occurs or is at least partially suppressed. The nitridation step has the effect that at least a top layer is created in the second dielectric which is in nitrided high-k material, i.e. no longer in the specified group of high-k materials. The layer thickness of the high-k material and the nitridation step may also be chosen such that substantially the whole layer of high-k material is nitrided or even the whole of the second dielectric is made up of the nitrided high-k material. An additional advantage of this nitridation step is that the trap density in the high-k layer can be decreased, which may improve the retention ability of the non-volatile memory device.

In another embodiment, the second dielectric may also comprise a high-k layer, which may be in a high-k material of the specified group, with a capping layer on top, which is in a high-k material not belonging to the specified group. The capping layer is preferably in AlN or AlON. This capping layer is a thin additional layer separating the control gate from the rest of the second dielectric to avoid the mentioned reduction in work-function.

Examples of high-k materials comprised in the specified group according to the invention are Al2O3, HfSiO, HfAlO and HfLaO. The second dielectric may be or is even preferably partly constructed in one of these materials, with the exception of the top layer at the interface with the control gate.

According to the embodiment, the material of the control gate or at least its bottom layer is preferably chosen such that its work-function is above (i.e. higher than) the work-function of the material of the channel. Suitable constructions are for example:

a control gate fully constructed in a material with metallic characteristics, such as for example a metal or a metallic compound, a control gate fully constructed in a p-type semiconductor material a control gate comprising a metallic bottom layer with a semiconductor layer on top, e.g. a metal inserted polysilicon (MIPS) structure with a thin metallic screening layer and a thick polysilicon layer.

DETAILED DESCRIPTION

Figure 1:
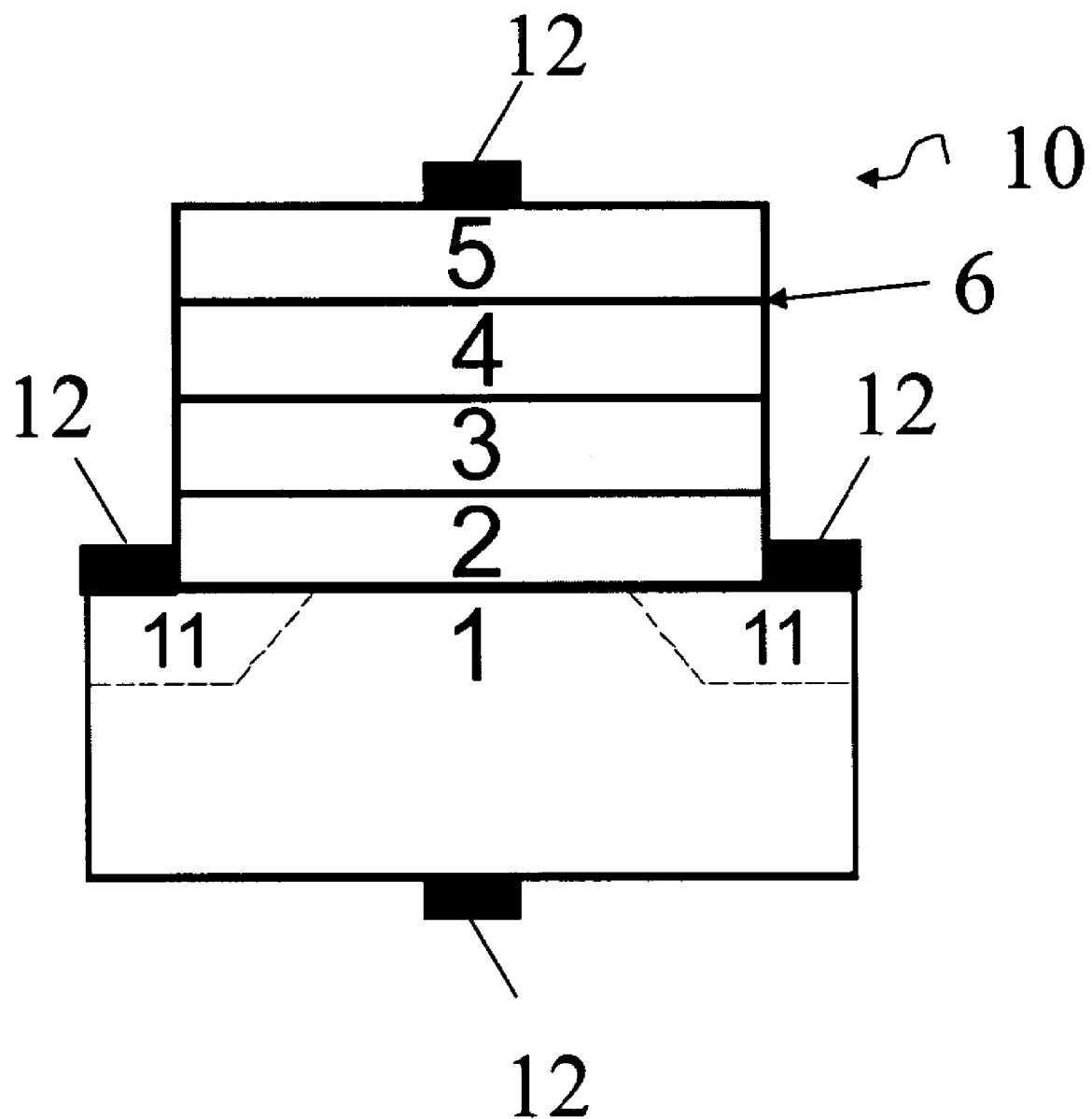
FIG. 1 shows a first embodiment of a non-volatile memory device.
Figure 2:
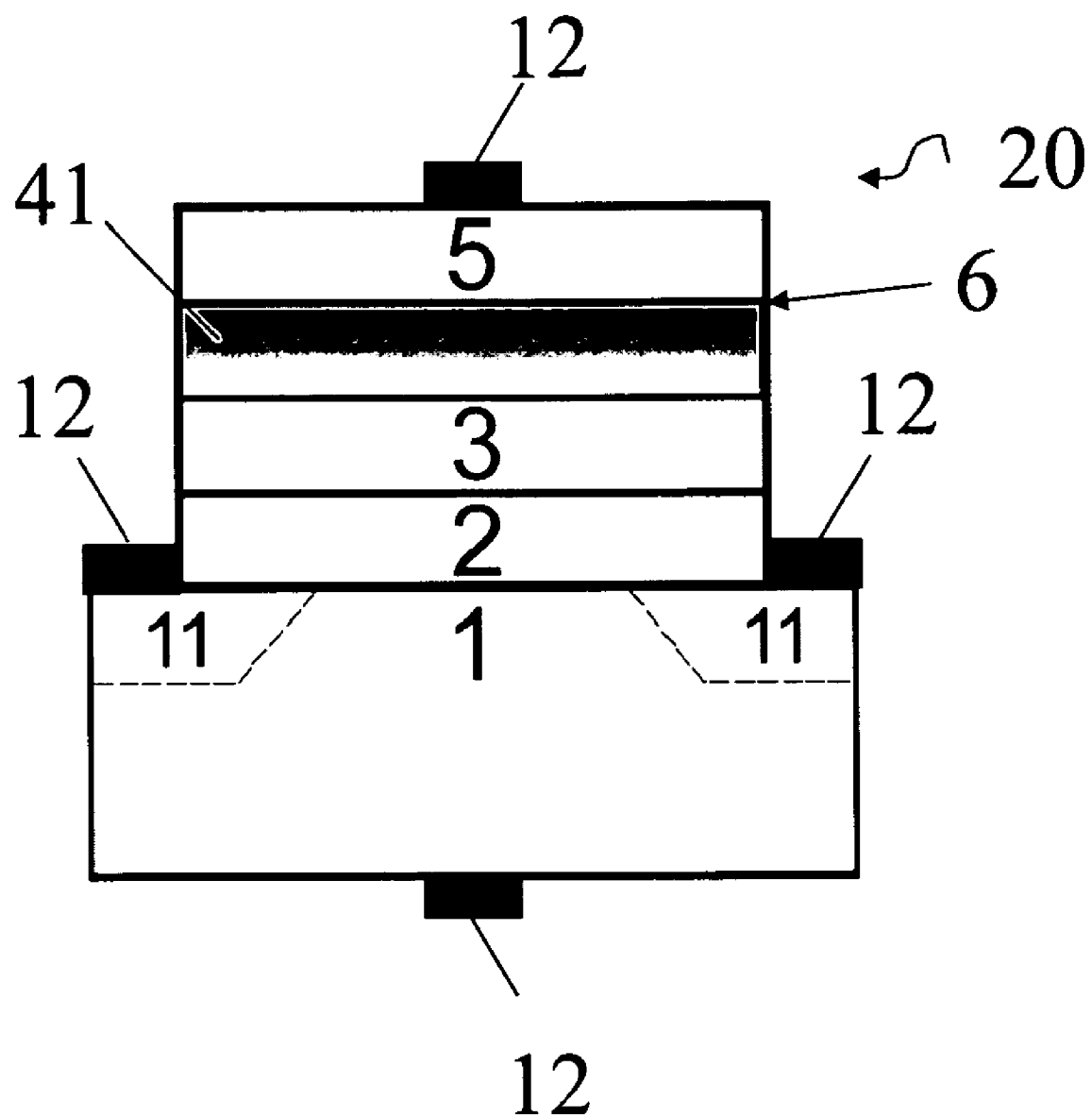
FIG. 2 shows a second embodiment of a non-volatile memory device.
Figure 3:
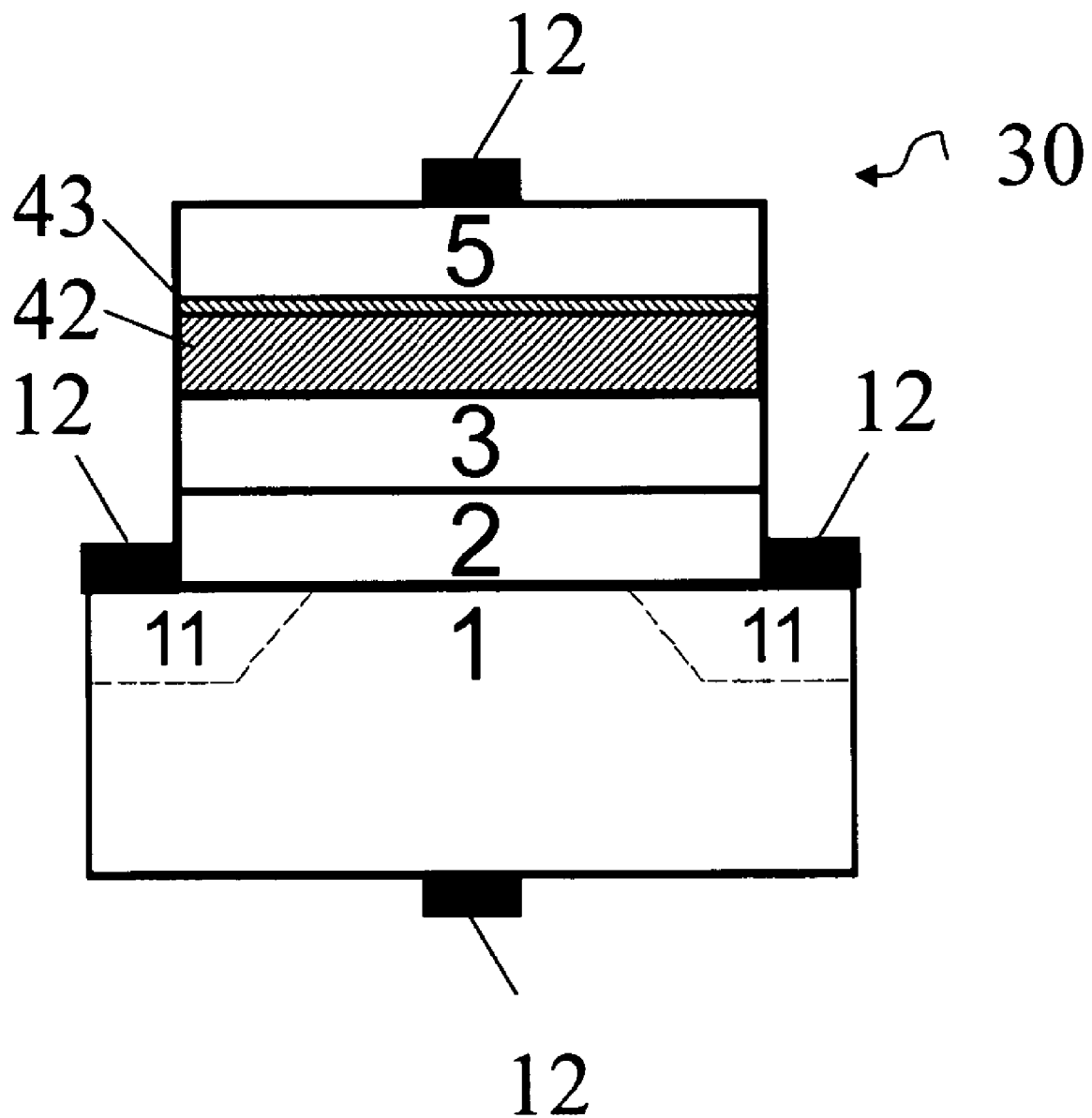
FIG. 3 shows a third embodiment of a non-volatile memory device.

FIGS. 1-3 show three exemplary embodiments of non-volatile memory cells 10, 20, 30 according to the invention, each comprising a substrate with a channel 1 in between two doped regions 11 (source and drain), a first dielectric 2 on top of the channel 1, a silicon floating gate 3 on top of the insulating layer 2, a second dielectric 4, 41, 42-43 on top of the silicon floating gate 3 and a control gate 5 on top of the second dielectric. The first dielectric is the so-called tunnel dielectric and the second dielectric is the so-called interpoly dielectric. Each of the layers 2-5 may in itself be a single layer or a stack of different layers having substantially the same functionality as the respective single layer which the stack replaces. Contacts 12 are provided at the doped regions 11, at the bottom of the substrate 1 and on top of the control gate 5.

The embodiments may also be applied in charge trapping non-volatile memory cells in which charge is stored in a charge trapping gate, such as for example a nitride layer, and the upper dielectric 4, 41, 42-43 is called the blocking dielectric.

According to the embodiments, an area of interest is the interface 6 between the second dielectric 4, 41, 42-43 and the control gate 5. In particular, a group of high-k materials is considered which are suitable for use in the dielectric in view of their high k-value, but which are to be avoided directly underneath this interface 6, i.e. at the top of the second dielectric, in view of the fact that the control gate 5 is constructed in a material which has a predefined high work-function and shows a tendency to reduce its work-function when in contact with one of these considered high-k materials after full device fabrication. This tendency is also known in the art as Fermi level pinning in the case of a p-type semiconductor gate 5. As a consequence of the embodiment, parasitic current injected from the top gate 5 to the storage region 3 is reduced, hence allowing to erase deeper (i.e. remove more of the charge stored in the floating or charge trapping gate 3) and enlarge the Program/Erase window.

In the embodiment of FIG. 1, the reduction in the work-function is avoided by selecting a predetermined high-k material for the second dielectric 4 outside the considered group of high-k materials. In this embodiment, the whole of the second dielectric 4 is constructed in this predetermined high-k material.

In the embodiment of FIG. 2, the second dielectric is constructed in one of the high-k materials of the group, e.g. Al2O3, HfSiO or HfAlO, but the reduction in the work-function at the interface 6 is avoided by introducing a post-deposition nitridation step to alter the material properties of the high-k material (in such a way that in the end the material in fact no longer belongs to the specified group). Thus, this embodiment has the advantage that the high-k materials of the considered group are not excluded from use in the second dielectric: they can be used as long as the top layer at the interface 6 is adequately nitrided. A further advantage of the nitridation step is that the trap density in the high-k layer 4 can be reduced, presumably improving the retention ability of the non-volatile memory cell 20. The nitridation can be carried out by e.g. using a Decoupled Plasma Nitridation (DPN) or an ammonia anneal.

A particular case where this method can be used is for interpoly or blocking dielectric stacks 41 containing Al2O3. In this situation, in the case of a p+-poly gate 5 the Fermi level pinning is better stabilized towards the Si valence band edge. Alternatively, the p-type-like character of a metal control gate 5 can be better maintained at the dielectric/gate interface. The metal control gate 5 can be realized with a material such as TaN, TiN, TiCN, TaCN, etc . . . The method is even more effective when used in conjunction with HfAlOx-based interpoly or blocking dielectrics 41 or even other dielectric materials that show Fermi level pinning towards midgap or the Si conduction band edge (n-type-like). These materials may include, e.g. HfSiOx, HfO2, etc. In addition, when used with a Boron-doped poly gate 5 to obtain a p-type work-function of the control gate 5, the nitridation can prevent penetration of B from the poly gate, while for the case of a metal gate 5 it potentially also improves the thermal stability of the interpoly/gate stack.

In the embodiment of FIG. 3, the second dielectric comprises a high-k layer 42, which may be in one of the materials of the group, topped by a thin dielectric capping layer 43 to avoid the reduction in work-function at the interface 6. The capping layer is in a high-k material such as for example AlN or AlON or other. For an effective control of the Fermi level pinning, the capping layer is preferably in a range of up to 2 nm. This capping layer can be used in conjunction with Al2O3-based interpoly/blocking dielectrics, HfAlOx-based dielectrics or other high-k dielectric materials that show a tendency to pin towards the Si conduction band edge (n-type), such as for example HfSiOx, HfO2, or other, and in conjunction with gates 5 as mentioned above with respect to the second embodiment.

In one embodiment, an AlN material is a preferred material for the capping layer 43 since it has a dielectric constant of around 8. When used in conjunction with a high-k material such as HfAlOx- (or other high-k with similar dielectric constants), it brings a marginal penalty in terms of effective oxide thickness (EOT) and almost no penalty for the Al2O3 case, k=~9.5. Hence the stack 42-43 can be redesigned so as to match the EOT specifications. In addition, AlN is reported to have large band offsets to Si (as a reference level), e.g. more than 3 eV for the conduction band offset, which means that it has intrinsically good isolation properties. Hence, addition of an AlN capping layer is able to control the Fermi level pinning, while its introduction is compatible with stringent retention requirements.

Figure 4:
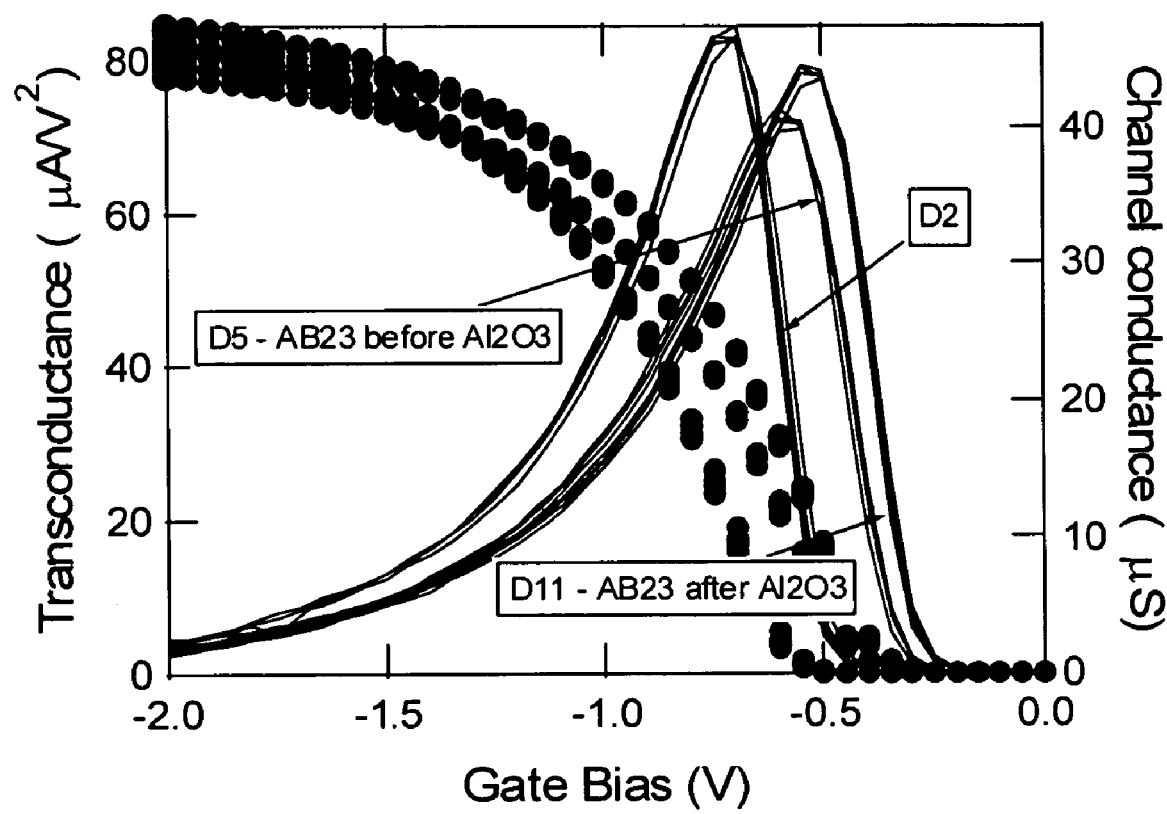
FIG. 4 shows current-voltage characteristics illustrating the shift in work-function of an electrode material due to nitridation of an upper part of an high-k dielectric on which the electrode material is to be deposited of a non-volatile memory device of a second embodiment.

FIG. 4 shows measured Id-Vg curves on pMOS devices having a polysilicon electrode and their corresponding transconductance for:
(i) reference split (labeled D2), featuring a HfSiOx gate dielectric deposition, followed by nitridation, (ii) split with no nitridation after Al2O3 gate dielectric deposition (labeled D5) and
(iii) split with nitridation (by Decoupled Plasma Nitrdation on an Applied Materials Centura DPN) after Al2O3 gate dielectric deposition (labeled D22). As observed, one effect of the nitridation is to shift the threshold voltage. This shift is attributed to modification of the work-function induced by the DPN. DPN (Decoupled Plasma Nitridation) allows for the incorporation into a dielectric a high nitrogen content at the interface dielectric/electrode and low nitrogen at the dielectric/substrate interface. By pulsing the RF generator the electron energy of the species in the plasma is significantly reduced, thereby enabling nitrogen to be incorporated at the top surface of the dielectric.

Figure 5:
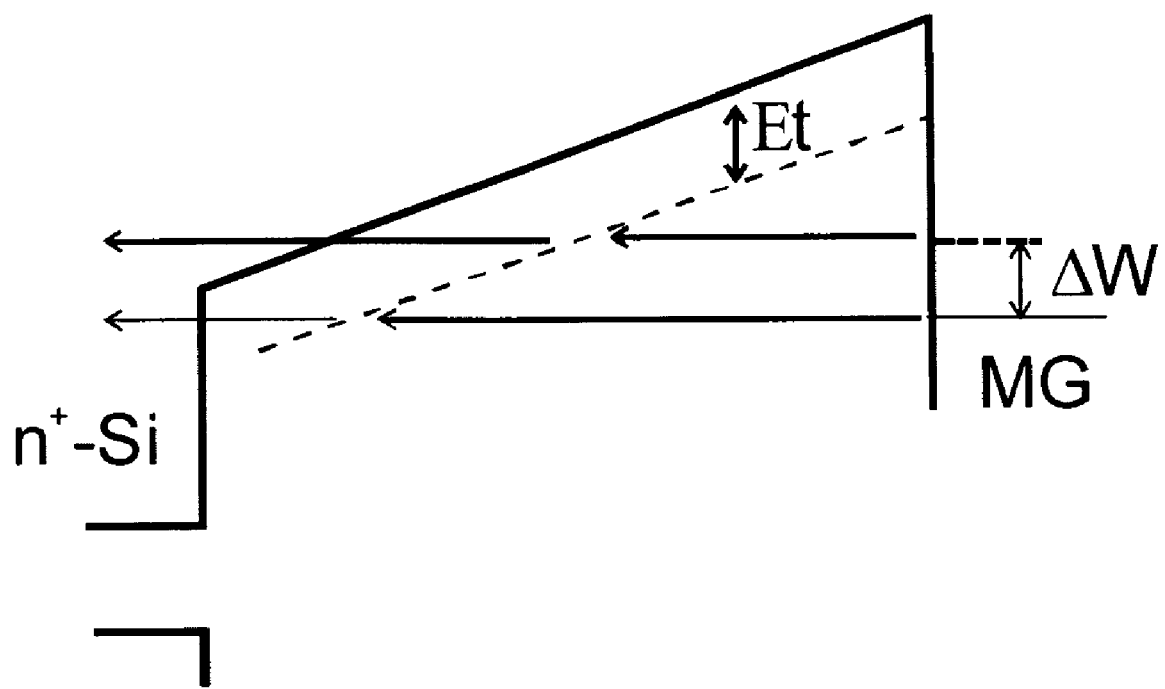
FIG. 5 shows the decrease in defect-assisted tunnelling by increasing the work-function of the gate electrode of a non-volatile memory device according to a first and a second embodiment.

FIG. 5 shows the effect of the invention on the energy band diagram from a floating gate 3 (n+-Si) over an interpoly dielectric 4 to a metal gate (MG) 5 during an erase operation. ΔW is the reduction in work-function which would occur if the interpoly dielectric 4 would be constructed in one of the high-k materials of the considered group without the nitridation step or the introduction of the capping layer.

It is clear that by avoiding this ΔW, tunnelling currents from the control gate to the floating gate are suppressed. If defects having a constant trap energy level Et, are present in the interpoly dielectric 4, then the tunnel-to-trap distance, i.e. the distance in which carriers must travel from the metal gate 5 into the interpoly dielectric 4 before reaching a charge trap at this energy level Et, decreases with decreasing work-function of the metal gate 5. If a higher work-function of the control gate 5 can be obtained or preserved, shallow charge traps, i.e. charge traps having an energy level Et near the conduction band of the dielectric 4, are less accessible thereby reducing the current from the metal gate 5 through the dielectric 4 towards the floating or charge storage gate 3.

While examples have been described in conjunction with present embodiments of the application, persons of skill in the art will appreciate that variations may be made without departure from the scope and spirit of the application. For example, the apparatus and methods described herein may be implemented in hardware, software, or a combination, such as a general purpose or dedicated processor running a software application through volatile or non-volatile memory. The true scope and spirit of the application is defined by the appended claims, which may be interpreted in light of the foregoing. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof.

The invention claimed is:

1. A method for manufacturing a non-volatile memory device, comprising the steps of:
providing a substrate comprising a channel between two doped regions;
applying a first dielectric on top of the channel, the first dielectric being a tunnel dielectric;
applying a charge storage medium on top of the tunnel dielectric;
applying a second dielectric on top of the charge storage medium; and
applying a control gate on top of the second dielectric, wherein at least a bottom layer of the control gate in contact with the second dielectric comprises a material having a predefined high work-function and showing a tendency to reduce its work-function when in contact with a group of high-k materials after full device fabrication;
wherein before applying the control gate, at least a top layer is constructed in the second dielectric for separating the control gate from the rest of the second dielectric, the top layer comprising a predetermined material, chosen outside the group for avoiding a reduction in the work-function of the material of the control gate,
wherein at least an upper part of the second dielectric comprises a high-k material of the group,
and wherein the top layer is constructed by nitridation of the high-k material.

2. The method according to claim 1, wherein the second dielectric is substantially completely constructed in the high-k material which is substantially completely nitrided.

3. The method according to claim 1, wherein the nitridation comprises a decoupled plasma nitridation.

4. The method according to claim 1, wherein the nitridation comprises an ammonia anneal step.

5. The method according to claim 1, wherein the material of at least the bottom layer of the control gate is chosen such that its work-function is above the work-function of the material of the channel.

6. The method according to claim 5, wherein the material of at least the bottom layer of the control gate is a material with metallic characteristics.

7. The method according to claim 6, wherein the control gate comprises:
a metal inserted polysilicon structure (MIPS) comprising a thin metallic screening layer in direct contact with the top layer of the second dielectric; and
a thick polysilicon layer on top of the MIPS.

8. The method according to claim 5, wherein the control gate is substantially completely constructed in a p-type semiconductor material.

* * * * *